United States Patent
Lee et al.

(10) Patent No.: US 11,062,744 B2
(45) Date of Patent: Jul. 13, 2021

(54) MEMORY DEVICE PERFORMING ZQ CALIBRATION, MEMORY SYSTEM, AND OPERATION METHOD OF MEMORY DEVICE

(71) Applicant: SAMSUNG ELECTRONICS CO., LTD., Suwon-si (KR)

(72) Inventors: Donghun Lee, Suwon-si (KR); Daesik Moon, Suwon-si (KR); Young-Soo Sohn, Seoul (KR); Young-Hoon Son, Hwaseong-si (KR); Ki-Seok Oh, Seoul (KR); Changkyo Lee, Seoul (KR); Hyun-Yoon Cho, Uiwang-si (KR); Kyung-Soo Ha, Hwaseong-si (KR); Seokhun Hyun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 16/262,250

(22) Filed: Jan. 30, 2019

(65) Prior Publication Data

US 2019/0362763 A1    Nov. 28, 2019

(30) Foreign Application Priority Data

May 25, 2018 (KR) .................... 10-2018-0059450

(51) Int. Cl.
*G11C 7/10* (2006.01)
*G06F 3/06* (2006.01)

(52) U.S. Cl.
CPC .......... *G11C 7/1048* (2013.01); *G06F 3/0604* (2013.01); *G06F 3/0659* (2013.01); *G06F 3/0673* (2013.01); *G11C 7/1087* (2013.01); *G11C 2207/2254* (2013.01)

(58) Field of Classification Search
CPC ............... G11C 7/1048; G11C 7/1087; G11C 2207/2254; G06F 3/0606; G06F 3/0659; G06F 3/0673
See application file for complete search history.

(56) References Cited

U.S. PATENT DOCUMENTS

| | | | |
|---|---|---|---|
| 5,467,455 A * | 11/1995 | Gay | H03H 7/40 326/30 |
| 6,492,853 B1 * | 12/2002 | Latham | H03K 19/1732 326/37 |
| 7,414,426 B2 * | 8/2008 | Cox | H04L 25/0298 326/30 |
| 7,839,159 B2 | 11/2010 | Nakamura et al. | |
| 7,853,842 B2 | 12/2010 | Kim et al. | |
| 9,160,339 B2 | 10/2015 | Matano | |
| 9,564,124 B2 | 2/2017 | Chung et al. | |
| 9,780,785 B2 | 10/2017 | Hardee | |

(Continued)

*Primary Examiner* — Vanthu T Nguyen
(74) *Attorney, Agent, or Firm* — F. Chau & Associates, LLC

(57) ABSTRACT

A memory device includes a driver that drives a data line connected with an external device, an internal ZQ manager that generates an internal ZQ start signal, a selector that selects one of the internal ZQ start signal and a ZQ start command from the external device, based on a ZQ mode, a ZQ calibration engine that generates a ZQ code by performing ZQ calibration in response to a selection result of the selector, and a ZQ code register that loads the ZQ code onto the driver in response to a ZQ calibration command from the external device.

19 Claims, 13 Drawing Sheets

(56) References Cited

U.S. PATENT DOCUMENTS

| | | | |
|---|---|---|---|
| 10,069,495 B2 * | 9/2018 | Jung | G11C 11/4074 |
| 10,283,201 B2 * | 5/2019 | Inoue | G11C 7/10 |
| 10,361,699 B2 * | 7/2019 | Lee | G11C 7/1057 |
| 10,454,721 B2 * | 10/2019 | Yamamoto | H03K 19/17764 |
| 2016/0284386 A1 | 9/2016 | McCall et al. | |
| 2017/0099050 A1 | 4/2017 | Lee et al. | |
| 2017/0345483 A1 | 11/2017 | Wang | |
| 2018/0076983 A1 | 3/2018 | Yamamoto et al. | |

* cited by examiner

MEMORY DEVICE PERFORMING ZQ CALIBRATION, MEMORY SYSTEM, AND OPERATION METHOD OF MEMORY DEVICE

CROSS-REFERENCE TO RELATED APPLICATION

This application claims priority under 35 U.S.C. § 119 to Korean Patent Application No. 10-2018-0059450, filed on May 25, 2018 in the Korean Intellectual Property Office, the disclosure of which is incorporated by reference herein in its entirety.

TECHNICAL FIELD

Exemplary embodiments of the inventive concept relate to a semiconductor memory, and more particularly, relate to a memory device, a memory system, and an operation method of the memory device.

DISCUSSION OF RELATED ART

Semiconductor memory devices are classified into volatile memory devices, which lose data stored therein at power-off, such as static random access memory (SRAM), dynamic RAM (DRAM), and synchronous DRAM (SDRAM), and nonvolatile memory devices, which retain data stored therein even at power-off, such as read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), and ferroelectric RAM (FRAM).

The DRAM device exchanges data with an external device (e.g., a system-on-chip (SoC) such as an application processor (AP)) through a data line. To transmit and receive data exactly, the DRAM device may perform various maintenance operations. For example, the DRAM device may improve the reliability of transmit/receive signals by adjusting the strength of drivers included in the DRAM device or setting an on-die termination (ODT) value, through periodical ZQ calibration. However, since the maintenance operations, such as the ZQ calibration, are managed or controlled by a memory controller or a SoC placed outside the DRAM device, the maintenance operations act as the overhead of the memory controller or SoC.

SUMMARY

According to an exemplary embodiment of the inventive concept, a memory device includes a driver that drives a data line connected with an external device, an internal ZQ manager that generates an internal ZQ start signal, a selector that selects one of the internal ZQ start signal and a ZQ start command from the external device, based on a ZQ mode, a ZQ calibration engine that generates a ZQ code by performing ZQ calibration in response to a selection result of the selector, and a ZQ code register that loads the ZQ code onto the driver in response to a ZQ calibration command from the external device.

According to an exemplary embodiment of the inventive concept, an operation method of a memory device which is connected with an external device through a data line includes selecting one of a ZQ start command received from the external device and an internally generated internal ZQ start signal based on a ZQ mode, generating a ZQ code by performing ZQ calibration in response to a result of the selection, receiving a ZQ latch command from the external device, and loading the ZQ code onto a driver which drives the data line, in response to the ZQ latch command.

According to an exemplary embodiment of the inventive concept, a memory system includes a memory controller that issues a ZQ start command, and a memory device that performs ZQ calibration in response to the ZQ start command in the case where a ZQ mode is an external ZQ mode and performs the ZQ calibration in response to an internally generated internal ZQ start signal in the case where the ZQ mode is an internal ZQ mode.

BRIEF DESCRIPTION OF THE FIGURES

The above and other objects and features of the inventive concept will become apparent by describing in detail example embodiments thereof with reference to the accompanying drawings.

DETAILED DESCRIPTION OF THE EMBODIMENTS

Figure 1:
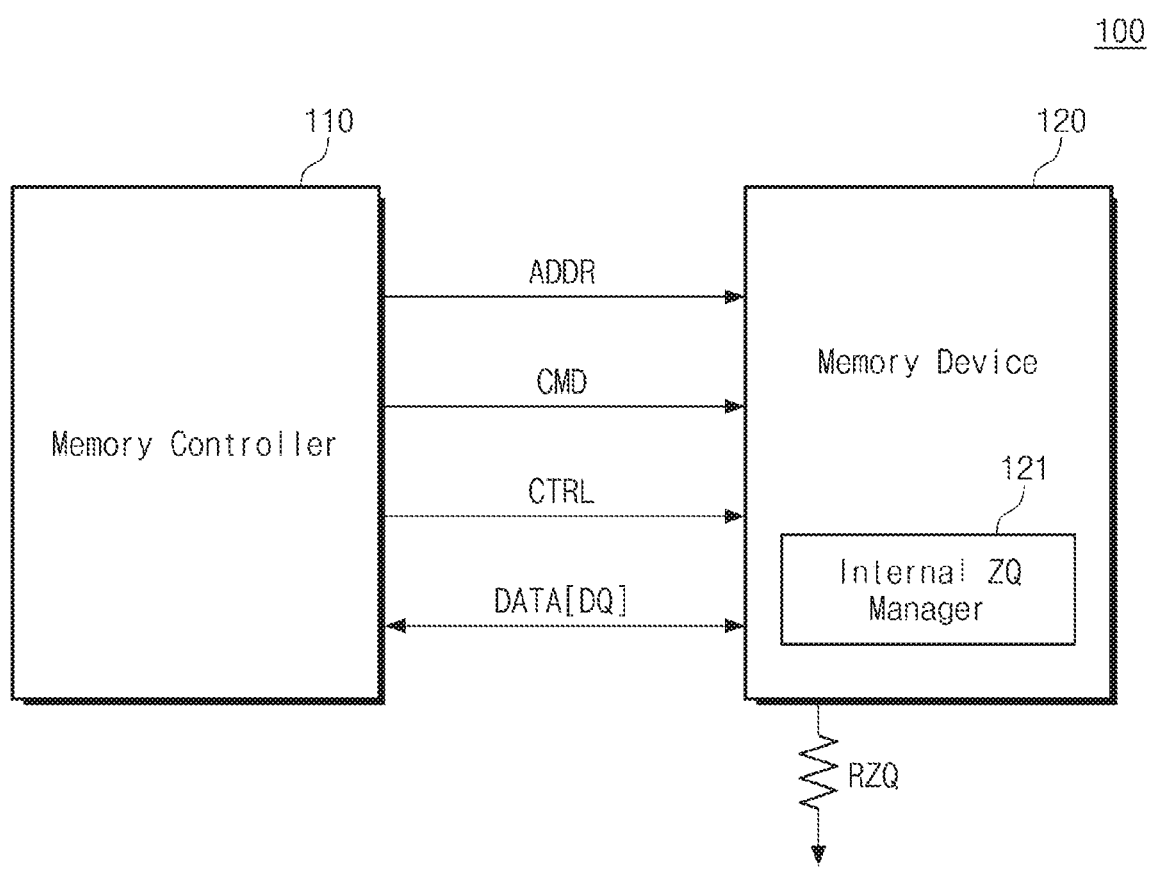
FIG. 1 is a block diagram illustrating a memory system according to an exemplary embodiment of the inventive concept.

Exemplary embodiments of the inventive concept provide a memory device, which performs ZQ calibration under the control of any one of a memory controller and a memory device depending on a ZQ mode, a memory system including the memory device, and an operation method of the memory device.

Below, exemplary embodiments of the inventive concept will be described in detail with reference to the accompanying drawings. Like reference numerals may refer to like elements throughout this application.

FIG. 1 is a block diagram illustrating a memory system according to an exemplary embodiment of the inventive concept. Referring to FIG. 1, a memory system 100 may include a memory controller 110 and a memory device 120.

The memory controller 110 may control the memory device 120. For example, to control the memory device 120, the memory controller 110 may transmit an address ADDR, a command CMD, and a control signal CTRL to the memory device 120, and may exchange data "DATA" with the memory device 120. In an exemplary embodiment of the inventive concept, the memory controller 110 may be a system-on-chip (SoC) such as an application processor (AP).

The memory device 120 may operate under the control of the memory controller 110. For example, in response to signals received from the memory controller 110, the memory device 120 may store DATA or may provide the stored DATA to the memory controller 110. In an exemplary embodiment of the inventive concept, the memory device 120 is a dynamic random access memory (DRAM) device, but the inventive concept is not limited thereto.

In an exemplary embodiment of the inventive concept, the memory controller 110 and the memory device 120 may communicate with each other based on a given interface. The given interface may be a low-power double data rate (LPDDR), but the inventive concept is not limited thereto. For example, the given interface may include at least one of various interfaces such as a DDR interface, a universal serial bus (USB) interface, a multimedia card (MMC) interface, a peripheral component interconnect (PCI) interface, a PCI-express (PCI-E) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), or a nonvolatile memory-express (NVM-e) interface.

In an exemplary embodiment of the inventive concept, depending on a set operation mode (or a ZQ mode), the memory device 120 may perform external ZQ calibration (or command-based calibration) or may perform internal ZQ calibration (or background calibration). The external ZQ calibration may refer to ZQ calibration which is performed under the control of the memory controller 110, and the internal ZQ calibration may refer to ZQ calibration which is performed under the control of the memory device 120.

In an exemplary embodiment of the inventive concept, the ZQ calibration may refer to an operation of adjusting the strength of output drivers connected with a data line DQ or any other signal line (e.g., a command/address line CA) of the memory device 120 or an operation of setting an on-die termination (ODT) value. The memory device 120 may perform the above-described ZQ calibration by using a ZQ resistor RZQ.

For example, in an external ZQ mode, the memory device 120 may perform the external ZQ calibration operation under the control of the memory controller 110. Alternatively, the memory device 120 may include an internal ZQ manager 121. The internal ZQ manager 121 may generate an internal signal for performing the internal ZQ calibration (or background calibration). In an internal ZQ mode, the memory device 120 may perform ZQ calibration in response to the generated internal signal without intervention of the memory controller 110.

As described above, the memory device 120 according to an exemplary embodiment of the inventive concept may perform the ZQ calibration in various manners depending on the set ZQ mode. Below, for convenience of description, the ZQ calibration which is performed under the control of the memory controller 110 is referred to as "external ZQ calibration", and the ZQ calibration which is performed under the control of the internal ZQ manager 121 is referred to as "internal ZQ calibration". Additionally, the ZQ mode in which the external ZQ calibration is performed is referred to as an "external ZQ mode", and the ZQ mode in which the internal ZQ calibration is performed is referred to as an "internal ZQ mode".

Figure 2:
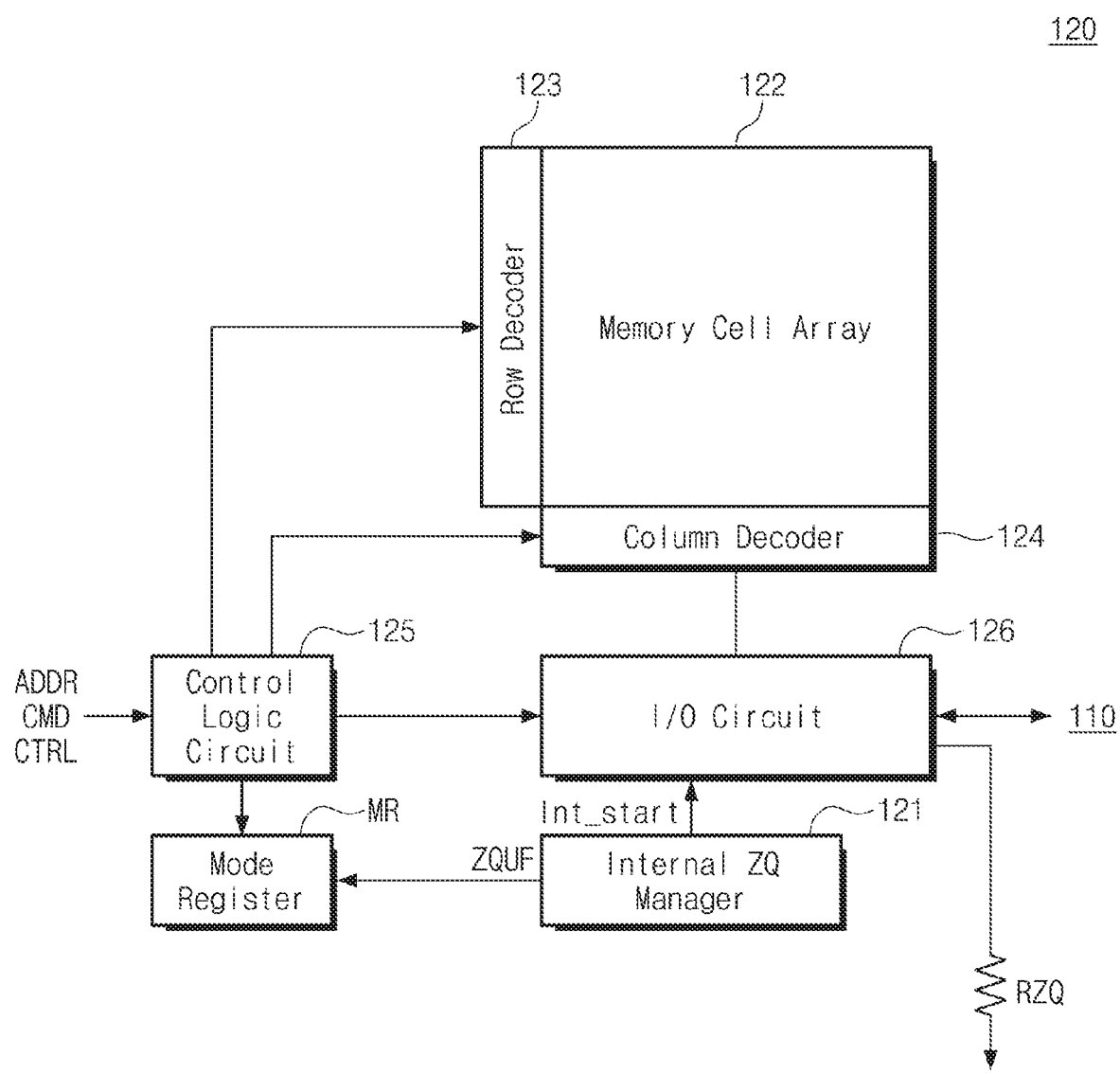
FIG. 2 is a block diagram illustrating a memory device of FIG. 1 in detail according to an exemplary embodiment of the inventive concept.

FIG. 2 is a block diagram illustrating a memory device of FIG. 1 in detail according to an exemplary embodiment of the inventive concept. Referring to FIG. 2, the memory device 120 may include the internal ZQ manager 121, a memory cell array 122, a row decoder 123, a column decoder 124, a control logic circuit 125, an input/output circuit 126, and a mode register MR.

The internal ZQ manager 121 may generate an internal ZQ calibration start signal Int_Start (hereinafter referred to as an "internal start signal") for performing the internal ZQ calibration. For example, as described above, the memory device 120 may perform the ZQ calibration under the control of the memory controller 110 or the internal ZQ manager 121, depending on the ZQ mode. In this case, the internal ZQ manager 121 may generate the internal start signal Int_Start for performing the internal ZQ calibration, in the internal ZQ mode.

In an exemplary embodiment of the inventive concept, the internal ZQ manager 121 may periodically generate the internal start signal Int_Start, in the internal ZQ mode. A period (hereinafter referred to as a "generation period") at which the internal start signal Int_Start is generated may be determined in advance in compliance with the protocol between the memory controller 110 and the memory device 120. In an exemplary embodiment of the inventive concept, information about the generation period of the internal start signal Int_Start may be stored in a specific area (e.g., OP[2] and OP[3] of MR28) of the mode register MR. In an exemplary embodiment of the inventive concept, the internal ZQ manager 121 may generate the internal start signal Int_start when the update of a ZQ code is required for a specific condition (e.g., a temperature change).

The internal ZQ manager 121 may set a ZQ update flag ZQUF to the mode register MR based on a result of the internal ZQ calibration. In an exemplary embodiment of the inventive concept, the ZQ update flag ZQUF may be stored in a specific area (e.g., OP[5] of MR4) of the mode register MR.

The memory cell array 122 may include a plurality of memory cells. Each of the plurality of memory cells may be a DRAM cell including a storage capacitor and a transistor, but the inventive concept is not limited thereto. The plurality of memory cells may be connected with a plurality of word lines and a plurality of bit lines.

The row decoder 123 may select at least one of the word lines under the control of the control logic circuit 125 and may drive the selected word line. The column decoder 124 may select at least one of the bit lines under the control of the control logic circuit 125 and may drive the selected bit line.

The control logic circuit 125 may receive the address ADDR, the command CMD, and the control signal CTRL from the memory controller 110, and may control components of the memory device 120 based on the received signals. In an exemplary embodiment of the inventive concept, the control logic circuit 125 may receive a ZQ start command ZQCal_Start from the memory controller 110 and may provide the received ZQ start command ZQCal_Start to the input/output circuit 126. In the case where the ZQ mode of the memory device 120 is the external ZQ mode, the input/output circuit 126 may perform ZQ calibration in response to the ZQ start command ZQCal_Start.

The input/output circuit 126 may transmit data provided from the memory controller 110 to the memory cell array 122, or may transmit data stored in the memory cell array 122 to the memory controller 110. In an exemplary embodiment of the inventive concept, the input/output circuit 126 may include components such as a sense amplifier, a write driver, an input/output driver, etc. Alternatively, the input/output circuit 126 may further include a ZQ calibration engine, a ZQ register, etc. for the purpose of performing the ZQ calibration.

In an exemplary embodiment of the inventive concept, the input/output circuit 126 may include a driver for driving the data line DQ or any other signal lines connected with the memory controller 110.

The mode register MR may store various information for operating the memory device 120. In an exemplary embodiment of the inventive concept, the memory controller 110 may store or set information to the mode register MR through a mode register write (MRW) operation. Alternatively, the memory controller 110 may read the information set to the mode register MR through a mode register read (MRR) operation.

The mode register MR may store various information about the ZQ mode of the memory device 120. In an exemplary embodiment of the inventive concept, information about the ZQ mode may be set as OP[5] of MR28. The mode register MR may include the ZQ update flag ZQUF. In an exemplary embodiment of the inventive concept, the ZQ update flag ZQUF may be set as OP[5] of MR4.

Figure 3:
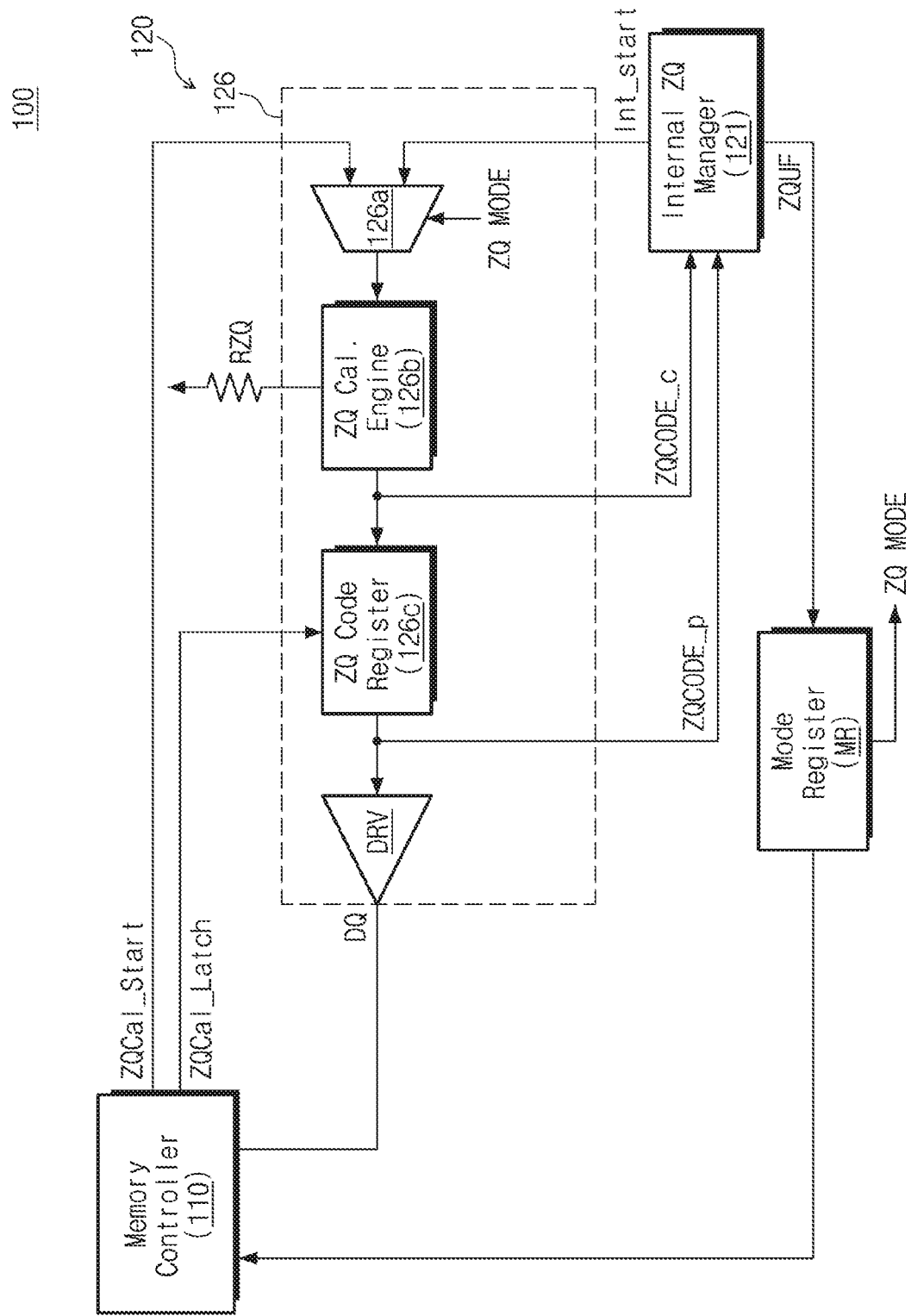
FIG. 3 is a block diagram illustrating a memory system according to an exemplary embodiment of the inventive concept.

FIG. 3 is a block diagram illustrating a memory system according to an exemplary embodiment of the inventive concept. For brevity of illustration, components which are unnecessary to describe the present exemplary embodiment will be omitted. Additionally, for clarity of description, the present exemplary embodiment will be described with respect to the ZQ calibration associated with an output driver DRV connected with one data line DQ.

In the following exemplary embodiments of the inventive concept, a description will be given where various components for performing ZQ calibration are included in the input/output circuit 126, but the inventive concept is not limited thereto. For example, various components for performing ZQ calibration may be implemented with separate hardware, separate software, or a combination thereof.

Referring to FIGS. 1 and 3, the input/output circuit 126 may include a selector 126a, a ZQ calibration engine 126b, a ZQ code register 126c, and the driver DRV.

The selector 126a may select any one of the ZQ start command ZQCal_Start from the memory controller 110 and the internal start signal Int_Start from the internal ZQ manager 121, based on a ZQ mode ZQ MODE. For example, the ZQ mode ZQ MODE may be information indicating the external ZQ mode or the internal ZQ mode. The ZQ mode ZQ MODE may be stored in a specific area (e.g., OP[5] of MR28) of the mode register MR.

In the case where the set ZQ mode ZQ MODE indicates the external ZQ mode, the selector 126a may select the ZQ start command ZQCal_Start from the memory controller 110. In the case where the set ZQ mode ZQ MODE indicates the internal ZQ mode, the selector 126a may select the internal start signal Int_Start from the internal ZQ manager 121.

In an exemplary embodiment of the inventive concept, in the case where the set ZQ mode ZQ MODE indicates the external ZQ mode, the internal start signal Int_Start from the internal ZQ manager 121 may be ignored by the selector 126a. In the case where the set ZQ mode ZQ MODE indicates the internal ZQ mode, the ZQ start command ZQCal_Start from the memory controller 110 may be ignored by the selector 126a.

The ZQ calibration engine 126b may perform ZQ calibration in response to a result (e.g., one of the ZQ start command ZQCal_Start and the internal start signal Int_Start) selected by the selector 126a. For example, the ZQ calibration engine 126b may generate a ZQ code ZQCODE_c for adjusting the strength of the driver DRV or the ODT value by performing ZQ calibration by using a ZQ resistor.

The ZQ code register 126c may load the ZQ code ZQCODE_c onto the driver DRV in response to a latch command ZQCal_Latch from the memory controller 110. The driver DRV may drive the data line DQ based on the ZQ code loaded from the ZQ code register 126c.

The internal ZQ manager 121 may generate the internal start signal Int_Start, in the internal ZQ mode. For example, the internal ZQ manager 121 may periodically generate the internal start signal Int_Start for the purpose of performing internal ZQ calibration.

In the internal ZQ mode, the internal ZQ manager 121 may compare a current ZQ code ZQCODE_c and a previous ZQ code ZQCODE_p. For example, the current ZQ code ZQCODE_c may indicate a result of recently performed ZQ calibration, and the previous ZQ code ZQCODE_p may indicate a ZQ code loaded onto the driver DRV. In the case where the current ZQ code ZQCODE_c is different from the previous ZQ code ZQCODE_p, the internal ZQ manager 121 may write or set the ZQ update flag ZQUF to the mode register MR.

The memory controller 110 may read the ZQ update flag ZQUF from the mode register MR and may issue the latch command ZQCal_Latch in response to the read ZQ update flag ZQUF.

In an exemplary embodiment of the inventive concept, the ZQ start command ZQCal_Start and the latch command ZQCal_Latch from the memory controller 110 may be provided as a multi-purpose command (MPC) from the memory controller 110.

As described above, ZQ calibration may be initiated by any one of the memory controller 110 and the internal ZQ manager 121 depending on the ZQ mode ZQ MODE of the memory device 120. In other words, since the initiative (or control right) of ZQ calibration is changed depending on the ZQ mode, the utilization of the memory controller 110 or the memory device 120 may be improved.

Figure 4:
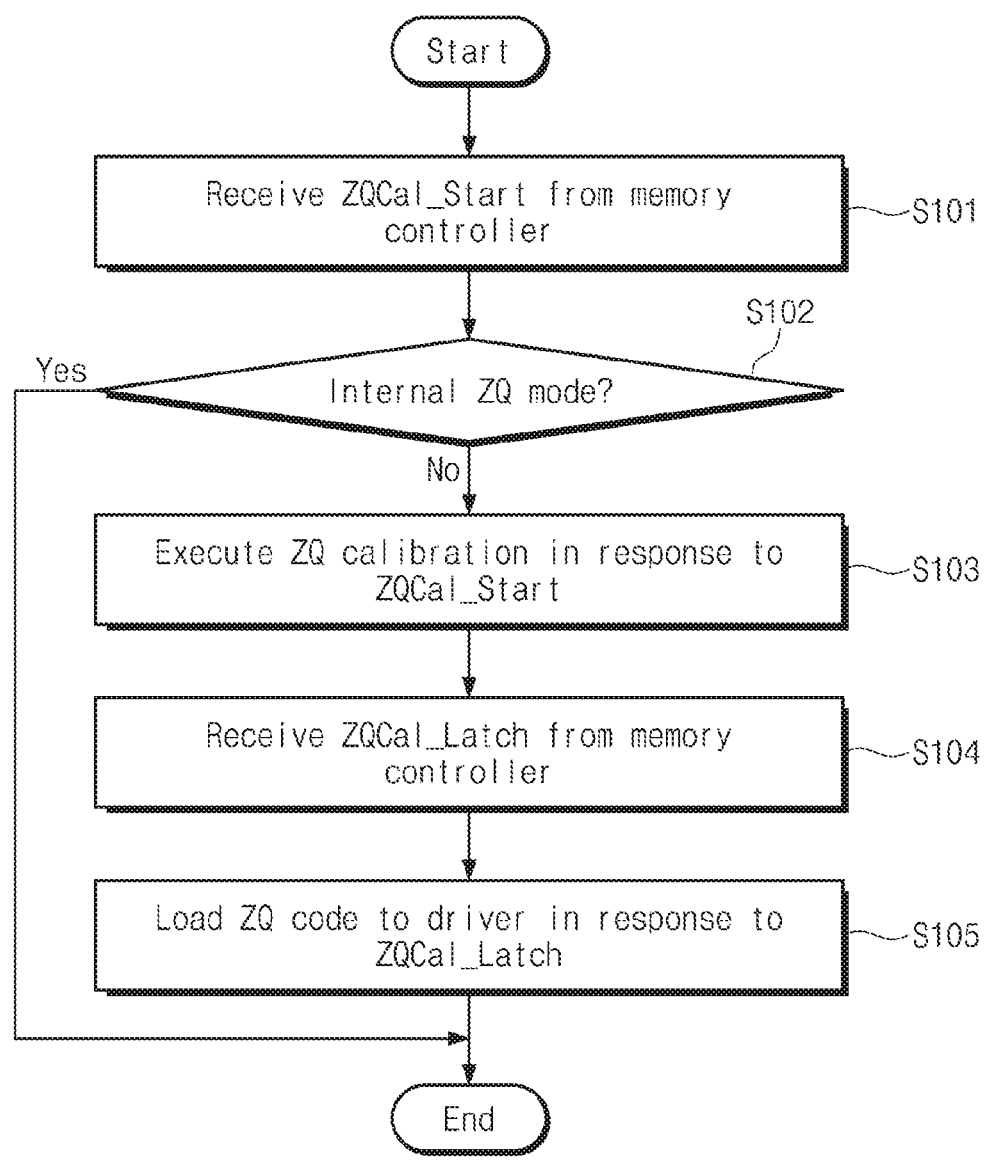
FIG. 4 is a flowchart illustrating external ZQ calibration of a memory device of FIG. 3 according to an exemplary embodiment of the inventive concept.
Figure 5:
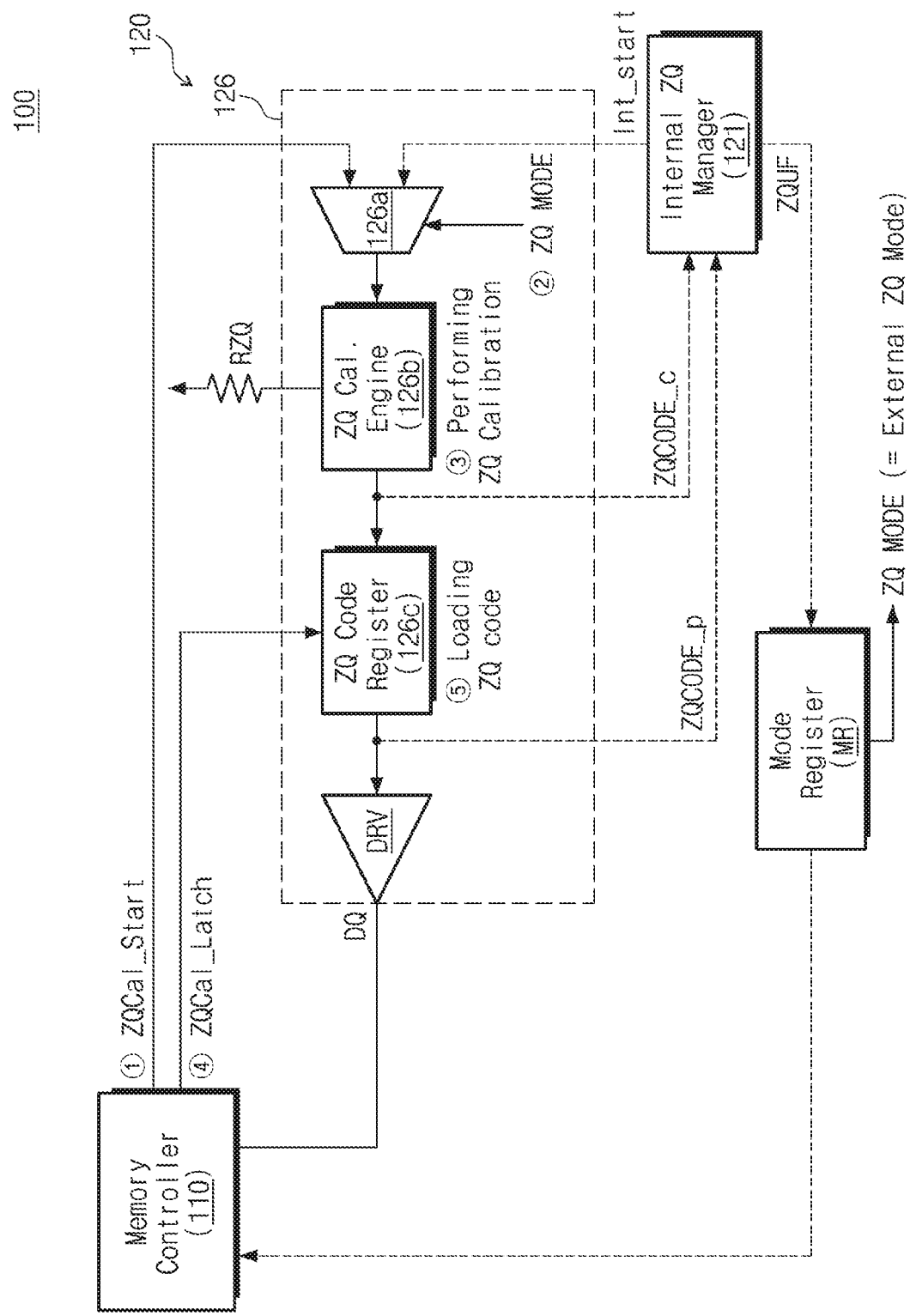
FIG. 5 is a diagram for describing an operation of the flowchart of FIG. 4 according to an exemplary embodiment of the inventive concept.

FIG. 4 is a flowchart illustrating external ZQ calibration of a memory device of FIG. 3 according to an exemplary embodiment of the inventive concept. FIG. 5 is a diagram for describing an operation of the flowchart of FIG. 4 according to an exemplary embodiment of the inventive concept. For example, ZQ calibration of the external ZQ mode, e.g., external ZQ calibration, will be described with reference to FIGS. 4 and 5.

Referring to FIGS. 4 and 5, in operation S101, the memory device 120 may receive the ZQ start command ZQCal_Start from the memory controller 110. For example, as illustrated in FIG. 5, the memory controller 110 may issue the ZQ start command ZQCal_Start (①). In an exemplary embodiment of the inventive concept, the ZQ start command ZQCal_Start may be issued from the memory controller 110 as the multi-purpose command MPC.

In an exemplary embodiment of the inventive concept, the memory controller 110 may periodically provide the ZQ start command ZQCal_Start to the memory device 120. In an exemplary embodiment of the inventive concept, in the case where a dynamic voltage and frequency scaling (DVFSQ) is deactivated in the memory device 120, the memory controller 110 may issue the ZQ start command ZQCal_Start. In an exemplary embodiment of the inventive concept, whether the DVFSQ of the memory device 120 is activated may be determined based on information stored in the mode register MR (in particular, OP[2] and OP[3] of MR19).

In operation S102, the memory device 120 may determine whether a set operation mode (e.g., ZQ mode) is an internal ZQ mode. For example, as illustrated in FIG. 5, the memory device 120 may determine the set operation mode based on the ZQ mode ZQ MODE stored in the mode register MR (in particular, OP[5] of MR28).

In the case where the set operation mode is the internal ZQ mode, the memory device 120 may not perform a separate operation. In other words, the memory device 120 may ignore the ZQ start command ZQCal_Start received from the memory controller 110. In the case where the set operation mode is not the internal ZQ mode (e.g., external ZQ mode), in operation S103, the memory device 120 may perform ZQ calibration in response to the received ZQ start command ZQCal_Start.

For example, as illustrated in FIG. 5, the selector 126a may select the ZQ start command ZQCal_Start based on the ZQ mode ZQ MODE (e.g., external ZQ mode) (②). The ZQ calibration engine 126b may perform ZQ calibration in response to a result (e.g., the ZQ start command ZQCal_Start) selected by the selector 126a (③).

In operation S104, the memory device 120 may receive the latch command ZQCal_Latch from the memory controller 110. For example, as illustrated in FIG. 5, the memory controller 110 may issue the latch command ZQCal_Latch (④). In an exemplary embodiment of the inventive concept, the memory controller 110 may transmit the ZQ start command ZQCal_Start and may transmit the latch command ZQCal_Latch to the memory device 120 after a predefined time passes. The predefined time may be determined depending on the number of memory devices sharing a ZQ resistor. In an exemplary embodiment of the inventive concept, as the number of memory devices sharing the ZQ resistor increases, the predefined time may increase.

In operation S105, the memory device 120 may load a ZQ code onto the driver DRV in response to the received latch command ZQCal_Latch. For example, as illustrated in FIG. 5, the ZQ code register 126c may load the ZQ code onto the driver DRV in response to the received latch command ZQCal_Latch. (⑤) In this case, the loaded ZQ code may be a result of ZQ calibration last performed by the ZQ calibration engine 126b.

As described above, in the case where the operation mode (e.g., ZQ mode) is the external ZQ mode, the memory device 120 may perform ZQ calibration and the loading of the ZQ code, in response to the ZQ start command ZQCal_Start and the latch command ZQCal_Latch from the memory controller 110, respectively.

In an exemplary embodiment of the inventive concept, in the case where the operation mode is the external ZQ mode, the internal ZQ manager 121 may not perform a separate operation. Accordingly, elements (e.g., Int_Start, comparison of ZQCODE_c and ZQCODE_p, or ZQUF) associated with an operation of the internal ZQ manager 121 are illustrated by a dotted line in FIG. 5. However, the inventive concept is not limited thereto. For example, even though the operation mode is the external ZQ mode, the internal ZQ manager 121 may perform a certain operation (e.g., an operation of generating an internal start signal periodically). However, since the operation mode is the external ZQ mode, the generated internal start signal Int_Start may be ignored by the selector 126a.

In an exemplary embodiment of the inventive concept, the driver DRV of the memory device 120 may drive the data line DQ based on the loaded ZQ code. In an exemplary embodiment of the inventive concept, in the case where the operation mode is set to the external ZQ mode, the memory controller 110 may periodically issue the ZQ start command ZQCal_Start for the purpose of maintaining accuracy of calibration.

Figure 6:
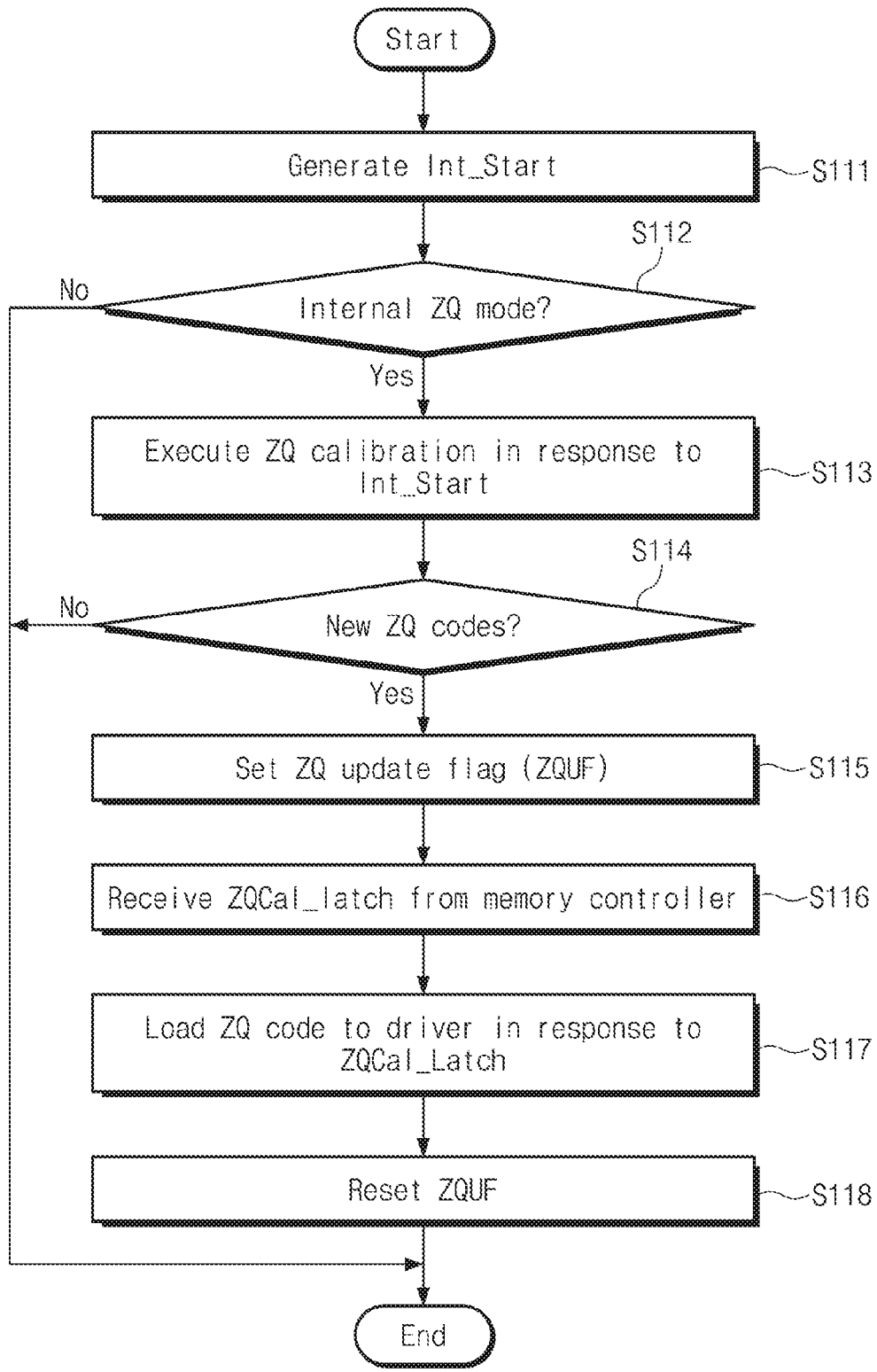
FIG. 6 is a flowchart illustrating internal ZQ calibration of a memory device of FIG. 3 according to an exemplary embodiment of the inventive concept.
Figure 7:
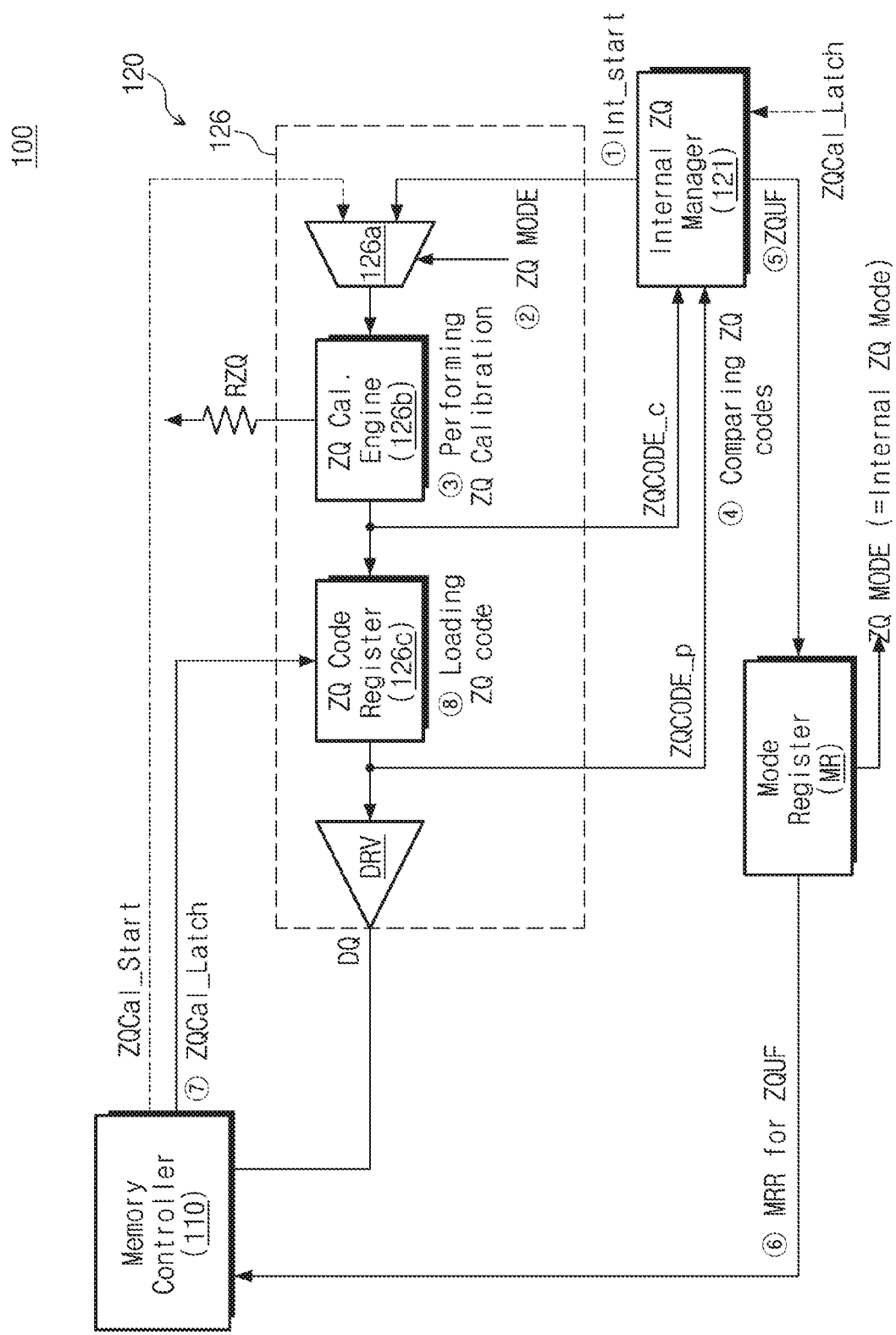
FIG. 7 is a diagram for describing an operation of the flowchart of FIG. 6 according to an exemplary embodiment of the inventive concept.

FIG. 6 is a flowchart illustrating internal ZQ calibration of a memory device of FIG. 3 according to an exemplary embodiment of the inventive concept. FIG. 7 is a diagram for describing an operation of the flowchart of FIG. 6 according to an exemplary embodiment of the inventive concept. ZQ calibration of the memory device 120 in internal ZQ mode, e.g., internal ZQ calibration, will be described with reference to FIGS. 6 and 7.

Referring to FIGS. 6 and 7, in operation S111, the memory device 120 may generate the internal start signal Int_Start. For example, as illustrated in FIG. 7, the internal ZQ manager 121 may generate the internal start signal Int_Start (①). In an exemplary embodiment of the inventive concept, the internal ZQ manager 121 may periodically generate the internal start signal Int_Start. In this case, the generation period of the internal start signal Int_Start may be a given time, and information about the generation period may be stored in a specific area (e.g., OP[2] and OP[3] of MR28) of the mode register MR.

In operation S112, the memory device 120 may determine whether a set operation mode is an internal ZQ mode. For example, the memory device 120 may determine whether the set operation mode is the internal ZQ mode, based on the ZQ mode ZQ MODE stored in the mode register MR. In an exemplary embodiment of the inventive concept, as illustrated in FIG. 7, the selector 126a may select or ignore the ZQ start command ZQCal_Start based on the ZQ MODE (②).

In the case where the set operation mode is not the internal ZQ mode (e.g., in the case of the external ZQ mode), the memory device 120 may not perform a separate operation. In other words, the generated internal start signal Int_Start may be ignored by the selector 126a of the memory device 120.

In the case where the set operation mode is the internal ZQ mode, in operation S113, the memory device 120 may perform ZQ calibration in response to the internal start signal Int_Start. For example, as illustrated in FIG. 7, the ZQ calibration engine 126b may perform the ZQ calibration in response to the internal start signal Int_Start selected by the selector 126a (③).

In operation S114, the memory device 120 may determine whether a new ZQ code is generated. For example, as illustrated in FIG. 7, the internal ZQ manager 121 may receive the current ZQ code ZQCODE_c and the previous ZQ code ZQCODE_p, and may compare the current ZQ code ZQCODE_c with the previous ZQ code ZQCODE_p (④). In the case where the current ZQ code ZQCODE_c is different from the previous ZQ code ZQCODE_p, the internal ZQ manager 121 may determine that a new ZQ code is generated.

In an exemplary embodiment of the inventive concept, the current ZQ code ZQCODE_c may indicate a ZQ code recently generated by ZQ calibration of the ZQ calibration engine 126b, and the previous ZQ code ZQCODE_p may indicate a ZQ code (a ZQ code currently loaded onto the driver DRV) loaded onto the driver DRV from the ZQ code register 126c.

In the case where a new ZQ code is not generated (e.g., in the case where the current ZQ code ZQCODE_c is identical to the previous ZQ code ZQCODE_p), the memory device 120 may not perform a separate operation (e.g., the ZQ update flag ZQUF may be not set into the mode register MR).

In the case where a new ZQ code is generated (e.g., in the case where the current ZQ code ZQCODE_c is different from the previous ZQ code ZQCODE_p), in operation S115, the memory device 120 may set the ZQ update flag ZQUF. For example, as illustrated in FIG. 7, the memory controller 110 may set the ZQ update flag ZQUF to the mode register MR (⑤). In an exemplary embodiment of the inventive concept, the ZQ update flag ZQUF may be set by the mode register write (MRW) operation. In an exemplary embodiment of the inventive concept, the ZQ update flag ZQUF may be set to a specific area (e.g., OP[5] of MR4) of the mode register MR.

In operation S116, the memory device 120 may receive the latch command ZQCal_Latch from the memory controller 110. For example, as illustrated in FIG. 7, the memory controller 110 may read the ZQ update flag ZQUF set to the mode register MR through a mode register read (MRR) operation (⑥). In other words, the memory controller 110 may issue the MRR to the memory device 120 to check the ZQ update flag ZQUF. The memory controller 110 may transmit the latch command ZQCal_Latch to the memory device 120 in response to the ZQ update flag ZQUF (⑦).

In an exemplary embodiment of the inventive concept, the memory controller 110 may issue the latch command ZQCal_Latch in the case where the memory device 120 is not in a power-down mode and an operation is not being performed on the data line DQ.

In operation S117, the memory device 120 may load the current ZQ code ZQCODE_c onto the driver DRV in response to the latch command ZQCal_Latch. For example, as illustrated in FIG. 7, the ZQ code register 126c may load the current ZQ code ZQCODE_c from the ZQ calibration engine 126b onto the driver DRV in response to the latch command ZQCal_Latch (⑧). In an exemplary embodiment of the inventive concept, after the current ZQ code ZQCODE_c is loaded, the driver DRV may drive the data line DQ based on the loaded ZQ code.

In operation S118, the memory device 120 may reset the ZQ update flag ZQUF. In an exemplary embodiment of the inventive concept, the ZQ update flag ZQUF may be reset before operation S117 (e.g., the loading of the ZQ code) is completed. Alternatively, the ZQ update flag ZQUF may be reset in response to the latch command ZQCal_Latch.

As described above, the memory device 120 according to an exemplary embodiment of the inventive concept may initiate ZQ calibration by the internal ZQ manager 121, in the internal ZQ mode. Accordingly, in the internal ZQ mode, since the memory controller 110 does not separately manage scheduling for ZQ calibration, the utilization of the memory controller 110 and the memory device 120 may be improved.

In the case where CA ODT (CA Bus Receiver On-Die-Termination) of the memory device 120 is in an inactive state and the memory device 120 is in an idle state, a self-refresh mode, or a power-down mode, the memory controller 110 may ignore the ZQ update flag ZQUF and may not issue the latch command ZQCal_Latch.

Figure 8:
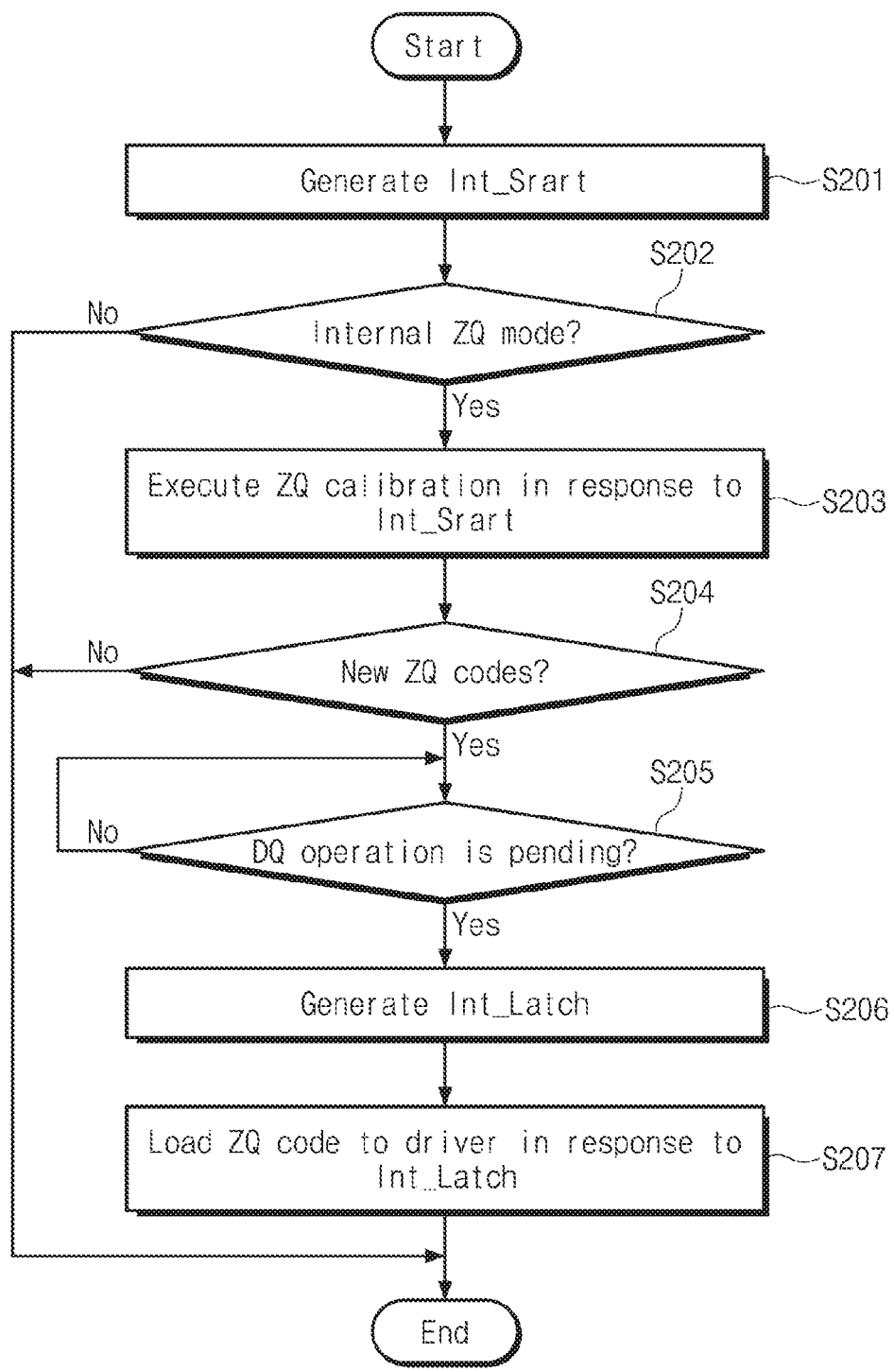
FIG. 8 is a flowchart illustrating an operation of a memory device according to an exemplary embodiment of the inventive concept.
Figure 9:
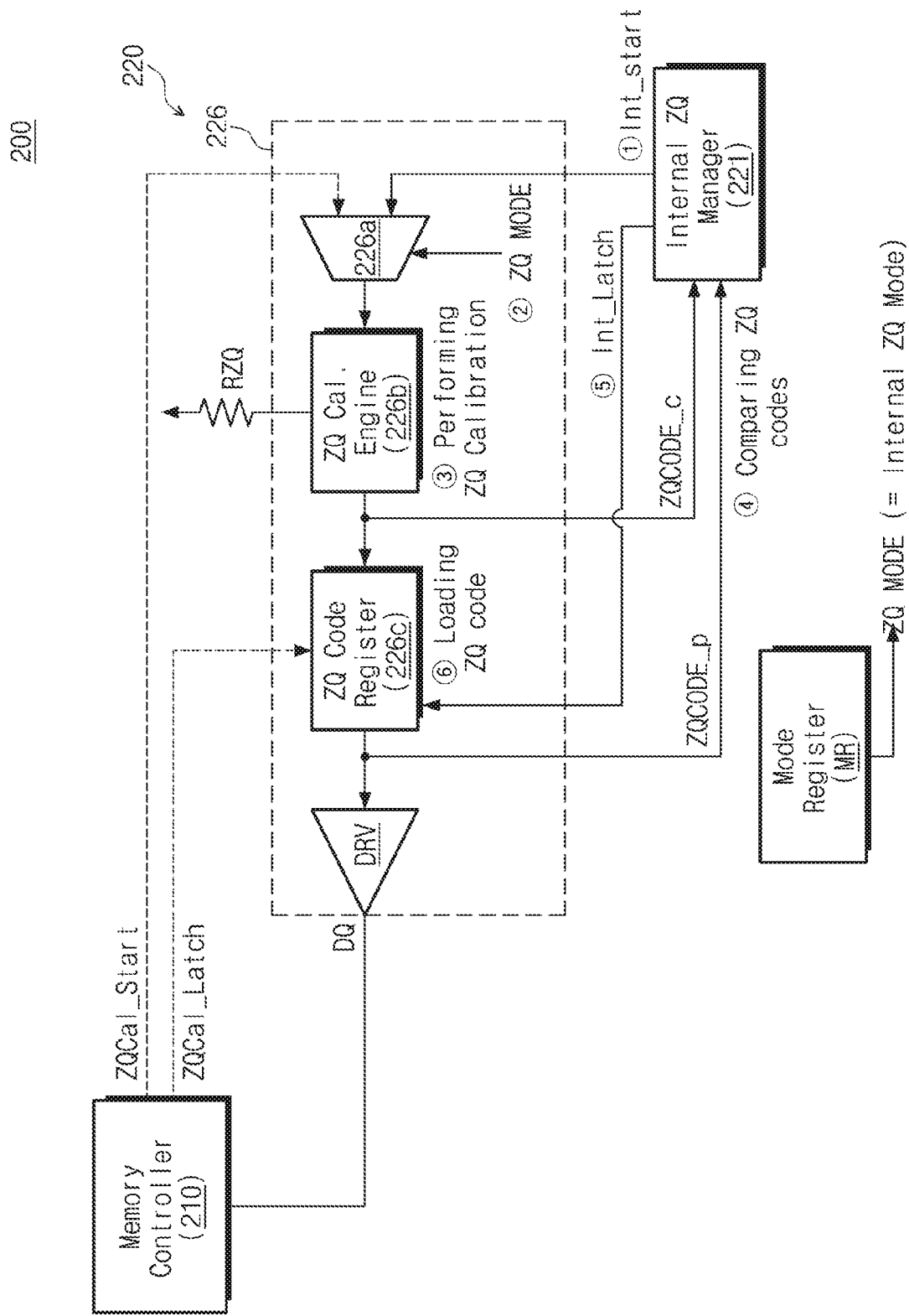
FIG. 9 is a block diagram for describing an operation of the flowchart of FIG. 8 according to an exemplary embodiment of the inventive concept.

FIG. 8 is a flowchart illustrating an operation of a memory device according to an exemplary embodiment of the inventive concept. FIG. 9 is a block diagram for describing an operation of the flowchart of FIG. 8 according to an exemplary embodiment of the inventive concept. For convenience of description, additional description associated with above-described components will be omitted to avoid redundancy. Internal ZQ calibration will be described with reference to FIGS. 8 to 9.

Referring to FIG. 9, a memory system 200 may include a memory controller 210 and a memory device 220. The memory device 220 may include an internal ZQ manager 221, the mode register MR, and an input/output circuit 226. The input/output circuit 226 may include a selector 226a, a ZQ calibration engine 226b, a ZQ code register 226c, and the driver DRV. The memory system 200 may be similar to the memory system 100 of FIG. 3, and thus repeat descriptions are omitted.

Referring to FIGS. 8 and 9, the memory system 200 may perform operation S201 to operation S204. Operation S201 to operation S204 may respectively correspond to operations ① to ④ illustrated in FIG. 9. Operation S201 to operation S204 may be similar to operation S111 to operation S114 of FIG. 6 and operations ① to ④ of FIG. 7, and thus, a description thereof is thus omitted.

In the case where a new ZQ code is generated, in operation S205, the memory device 220 may determine whether an operation (e.g., a DQ operation) is being performed on the data line DQ. For example, since the memory device 220 can perform internal ZQ calibration regardless of an operation of the memory controller 210 in the internal ZQ mode, the memory controller 210 may exchange data with the memory device 220 through the data line DQ regardless of the internal ZQ calibration. In other words, the operation (DQ operation) for the data line DQ is being performed by the memory controller 210.

In an exemplary embodiment of the inventive concept, loading of the ZQ code may be performed after the operation for the data line DQ is completed. In other words, in the case where the operation for the data line DQ is being performed, the memory device 220 may not perform a loading operation until the operation for the data line DQ is completed.

In the case where the operation for the data line DQ is completed, in operation S206, the memory device 220 may generate an internal latch signal Int_Latch. For example, as illustrated in FIG. 9, an internal ZQ manager 221 may generate the internal latch signal Int_Latch (⑤). The internal latch signal Int_Latch may be generated after the operation for the data line DQ is completed.

In operation S207, the memory device 220 may load the ZQ code onto the driver DRV in response to the internal latch signal Int_Latch. For example, as illustrated in FIG. 9, the ZQ code register 226c may load the ZQ code onto the driver DRV in response to the internal latch signal Int_Latch (⑥).

As described above, in the internal ZQ mode, the memory device 220 may perform an auto-ZQ code loading operation as well as an auto-ZQ calibration operation.

Figure 10:
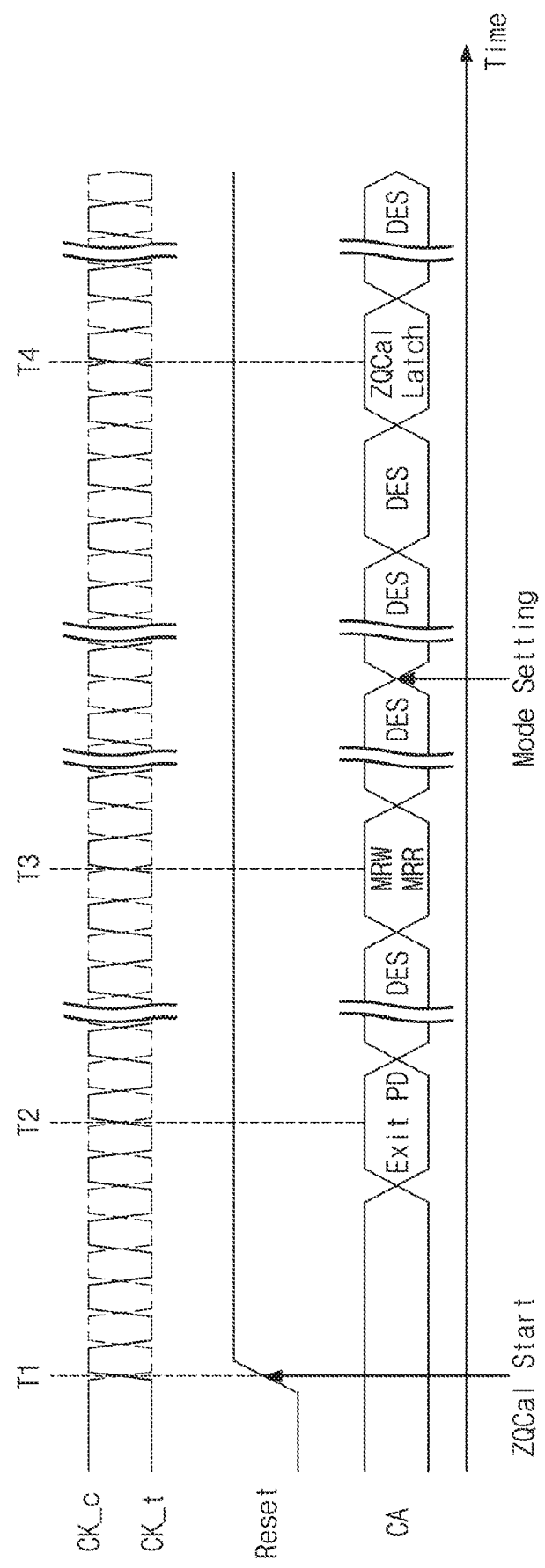
FIG. 10 is a timing diagram illustrating an initial operation of a memory system according to an exemplary embodiment of the inventive concept.

FIG. 10 is a timing diagram illustrating an initial operation of a memory system according to an exemplary embodiment of the inventive concept. For example, ZQ calibration and a ZQ mode setting method, which will be performed in an initial operation of the memory system 100, will be described with reference to FIG. 10. For convenience of description, the timing diagram of FIG. 10 will be described with reference to the memory system 100 of FIG. 1.

Referring to FIGS. 1 and 10, the memory device 120 may receive clock signals CK_c and CK_t, a reset signal Reset, and a command/address CA from the memory controller 110. For example, the signals of FIG. 10 may correspond to the command CMD, the address ADDR, and the control signal CTRL of FIG. 1.

In an initialization operation or a power-up operation, at a first time T1, the reset signal Reset may transition from logical low to logical high. In this case, the memory device 120 may start ZQ calibration. In other words, in the initialization operation or the power-up operation, the memory device 120 may automatically perform ZQ calibration.

Afterwards, at a second time T2, the memory controller 110 may transmit a power-down exit command Exit PD to the memory device 120. Afterwards, at a third time T3 when a time passes, the memory controller 110 may transmit mode register write (MRW) and mode register read (MRR) commands to the memory device 120. The memory controller 110 may set parameters of the memory device 120 through the mode register write (MRW) and mode register read (MRR) commands. For example, an operation mode (e.g., the internal ZQ mode or the external ZQ mode) of the memory device 120 may be set through the mode register write (MRW) and mode register read (MRR) commands from the memory controller 110.

Afterwards, at a fourth time T4 when a time passes, the memory controller 110 may transmit the latch command ZQCal_Latch to the memory device 120. The memory device 120 may load a ZQ code onto each driver in response to the latch command ZQCal_Latch.

Afterwards, the memory device 120 may operate based on the operation method described with reference to FIGS. 1 to 9, in the set ZQ mode. As described above, the operation mode of the memory device 120 may be set in the initialization operation or the power-up operation of the memory system 100. However, the inventive concept is not limited thereto.

In an exemplary embodiment of the inventive concept, deselect signals DES between the second to fourth times T2, T3, and T4 of FIG. 10 are illustrated. This is an example for describing the present exemplary embodiment clearly, and the inventive concept is not limited thereto. The deselect signal DES may be replaced with another valid command or signals.

Figure 11:
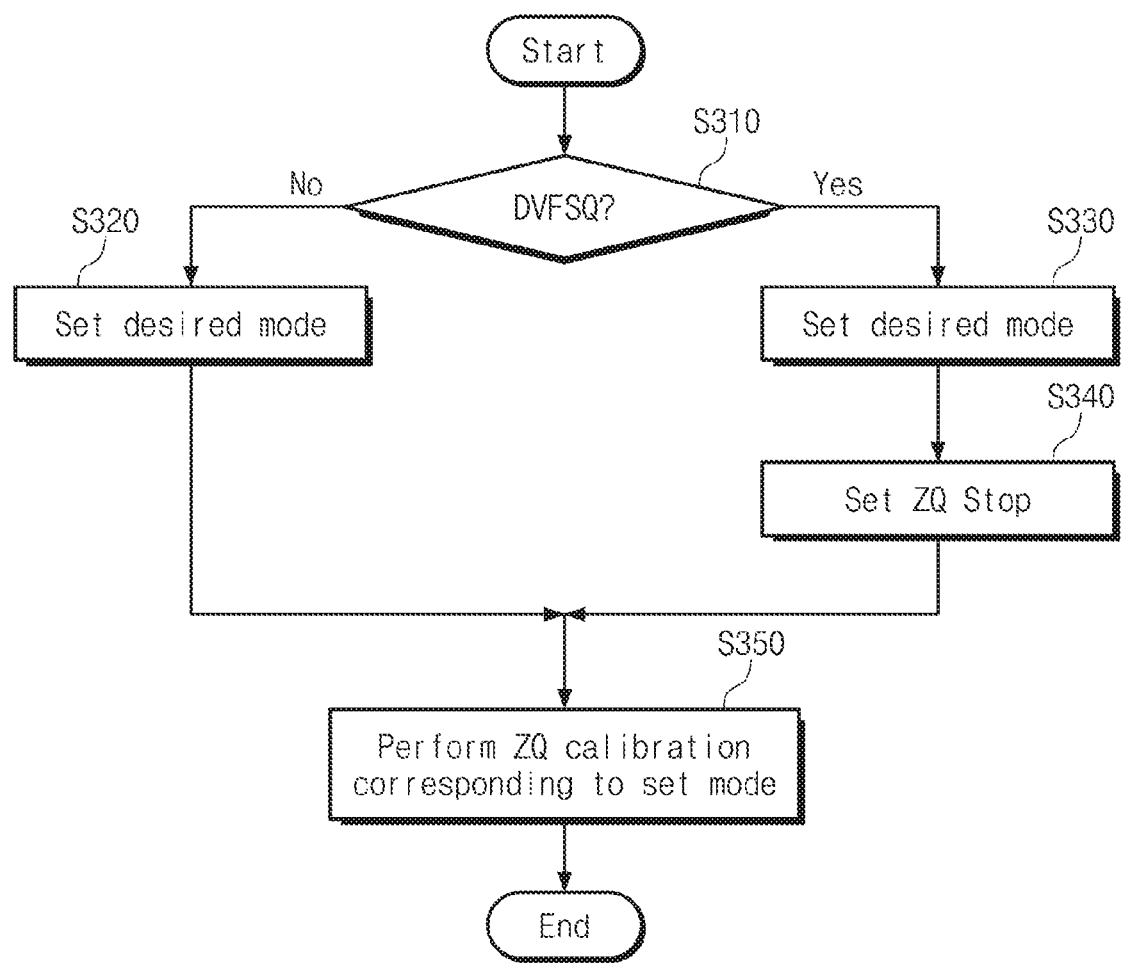
FIG. 11 is a flowchart illustrating an operation method of a memory system according to an exemplary embodiment of the inventive concept.

FIG. 11 is a flowchart illustrating an operation method of a memory system according to an exemplary embodiment of the inventive concept. In particular, a method for changing a ZQ mode during an operation of the memory system will be described with reference to FIG. 11. For convenience of description, the flowchart of FIG. 11 will be described with reference to the memory system 100 of FIG. 1.

Referring to FIGS. 1 and 11, in operation S310, the memory system 100 may determine whether a dynamic voltage and frequency scaling (DVFSQ) mode is activated in the memory device 120. The DVFSQ mode may indicate a mode where a driving voltage of the memory device 120 decreases to a specific level. For example, in the case where the DVFSQ mode is deactivated, a driving voltage of the memory device 120 may be a first voltage (e.g., 0.5 V); in the case where the DVFSQ mode is activated, the driving voltage of the memory device 120 may be a second voltage (e.g., 0.3 V) that is lower than the first voltage. In an exemplary embodiment of the inventive concept, information about the DVFSQ mode may be set in a specific area (e.g., OP[0] and OP[1] of MR19) of the mode register MR.

In the case where the DVFSQ mode is not activated in the memory device 120, in operation S320, the memory system 100 may set a desired ZQ mode. For example, in the case where a current ZQ mode of the memory device 120 is an internal mode (or an external mode), the memory controller 110 may change the ZQ mode of the memory device 120 to an external mode (or an internal mode) by changing a value of a specific area (e.g., OP[5] of MP28) of the mode register MR of the memory device 120.

In the case where the DVFSQ mode is activated in the memory device 120, in operation S330, the memory system 100 may set the desired ZQ mode. Operation S330 is similar to operation S320. Thus, additional descriptions will be omitted to avoid redundancy.

In operation S340, the memory system 100 may set ZQ stop information. For example, while the DVFSQ is activated, the memory controller 110 may set the ZQ stop information to the memory device 120 such that the memory device 120 prevents ZQ calibration from being performed. In an exemplary embodiment of the inventive concept, the ZQ stop information may be set to a specific area (e.g., OP[1] of MR28) of the mode register MR.

In an exemplary embodiment of the inventive concept, in the case where the ZQ stop information is set in the internal ZQ mode, the ZQ calibration of the memory device 120 may be stopped for a time. For example, in the case where the ZQ stop information is set in the internal ZQ mode, the internal ZQ manager 121 may not generate an internal start signal for a time, the selector 126a may not select the internal start signal for a time, or the ZQ calibration engine 126b may not perform ZQ calibration for a time.

In an exemplary embodiment of the inventive concept, in the case where another device (e.g., a memory controller) needs to use a ZQ resistor, the ZQ stop information may be set in the memory device 120. Afterwards, in the case where the use of the ZQ resistor is completed in another device, the ZQ stop information may be reset.

In an exemplary embodiment of the inventive concept, in the external ZQ mode, in the case where another device needs to use the ZQ resistor, the memory controller 110 may not issue the ZQ start command ZQCal_Start regardless of the ZQ stop information.

Afterwards, in operation S350, the memory system 100 may perform ZQ calibration corresponding to the set ZQ mode. For example, in the case where the set ZQ mode is an external mode, the memory system 100 may perform ZQ calibration according to the exemplary embodiment described with reference to FIGS. 4 and 5; in the case where the set ZQ mode is an internal mode, the memory system 100 may perform ZQ calibration according to the exemplary embodiment described with reference to FIGS. 6 and 7 or FIGS. 8 and 9.

In an exemplary embodiment of the inventive concept, operation S330 and operation S340 may be performed at substantially the same time. Alternatively, operation S340 may be performed prior to operation S330. For example, in a state where the DVFSQ mode is activated, in the case where the ZQ mode is changed from the external mode to the internal mode, information about the ZQ mode and the ZQ stop information may be written to the mode register MR at substantially the same time, or the ZQ stop information may be written to the mode register MR prior to the information about the ZQ mode.

Figure 12:
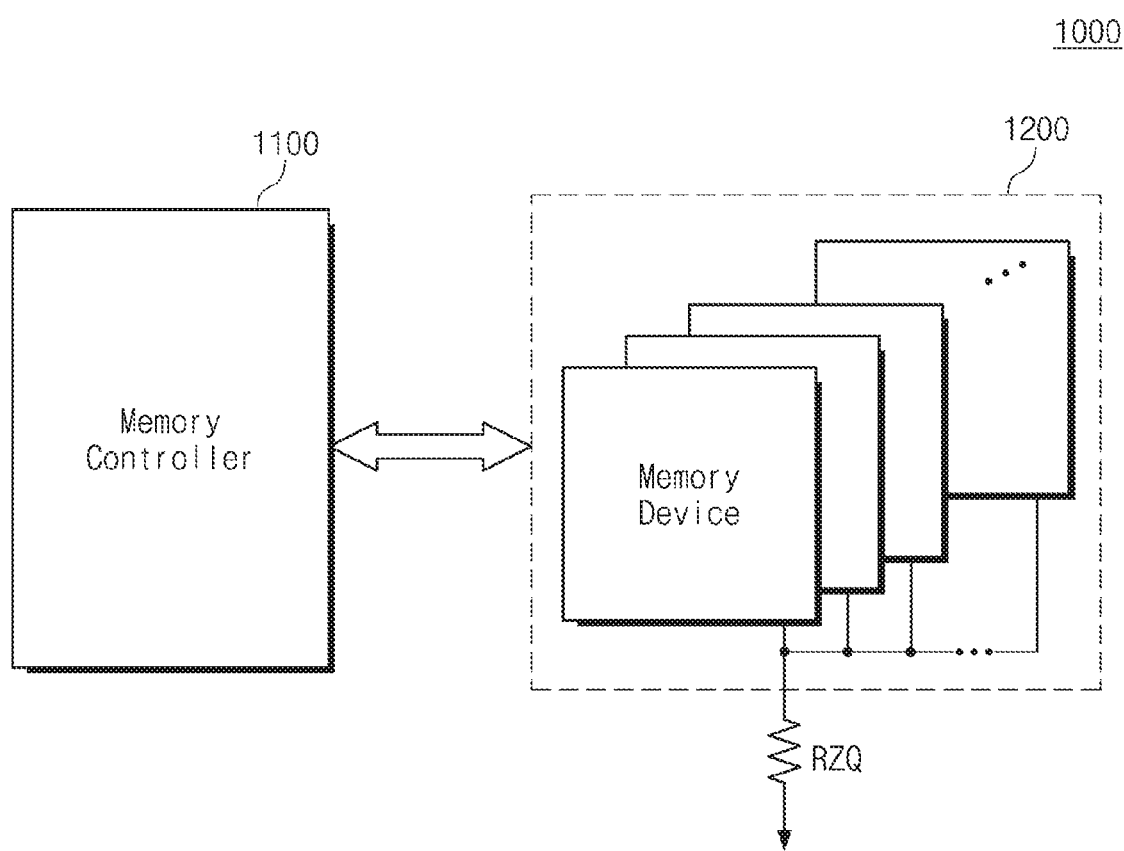
FIG. 12 is a block diagram illustrating a memory system according to an exemplary embodiment of the inventive concept.

FIG. 12 is a block diagram illustrating a memory system according to an exemplary embodiment of the inventive concept. Referring to FIG. 12, a memory system 1000 may include a memory controller 1100 and a plurality of memory devices 1200. The plurality of memory devices 1200 may operate based on the above-described operation method (e.g., ZQ calibration based on a ZQ mode).

In an exemplary embodiment of the inventive concept, the plurality of memory devices 1200 may share one ZQ resistor RZQ. In the external ZQ mode, the plurality of memory devices 1200 may sequentially perform ZQ calibration by using the ZQ resistor RZQ. In an exemplary embodiment of the inventive concept, any one of the plurality of memory devices 1200 may be a master device, and the remaining memory devices may be slave devices. The memory controller 110 may transmit the ZQ start command ZQCal_Start to a master die, and the master die may perform ZQ calibration in response to the ZQ start command ZQCal_Start. After the ZQ calibration of the master die is ended, ZQ calibration may be sequentially performed on other slave devices. After ZQ calibration for all the memory devices 1200 sharing the ZQ resistor RZQ are ended, the memory controller 1100 may transmit the latch command ZQCal_Latch to the memory devices 1200, and the memory devices 1200 may load a ZQ code onto each driver in response to the latch command ZQCal_Latch.

In an exemplary embodiment of the inventive concept, in the case where the ZQ start command ZQCal_Start is transmitted to a memory device which is not designated as a master device, the ZQ start command ZQCal_Start may be ignored.

In an exemplary embodiment of the inventive concept, the memory controller 1100 may transmit the ZQ start command ZQCal_Start and may issue the latch command ZQCal_Latch after a time passes. In this case, the time may be determined depending on the number of memory devices 1200 sharing the ZQ resistor RZQ.

Figure 13:
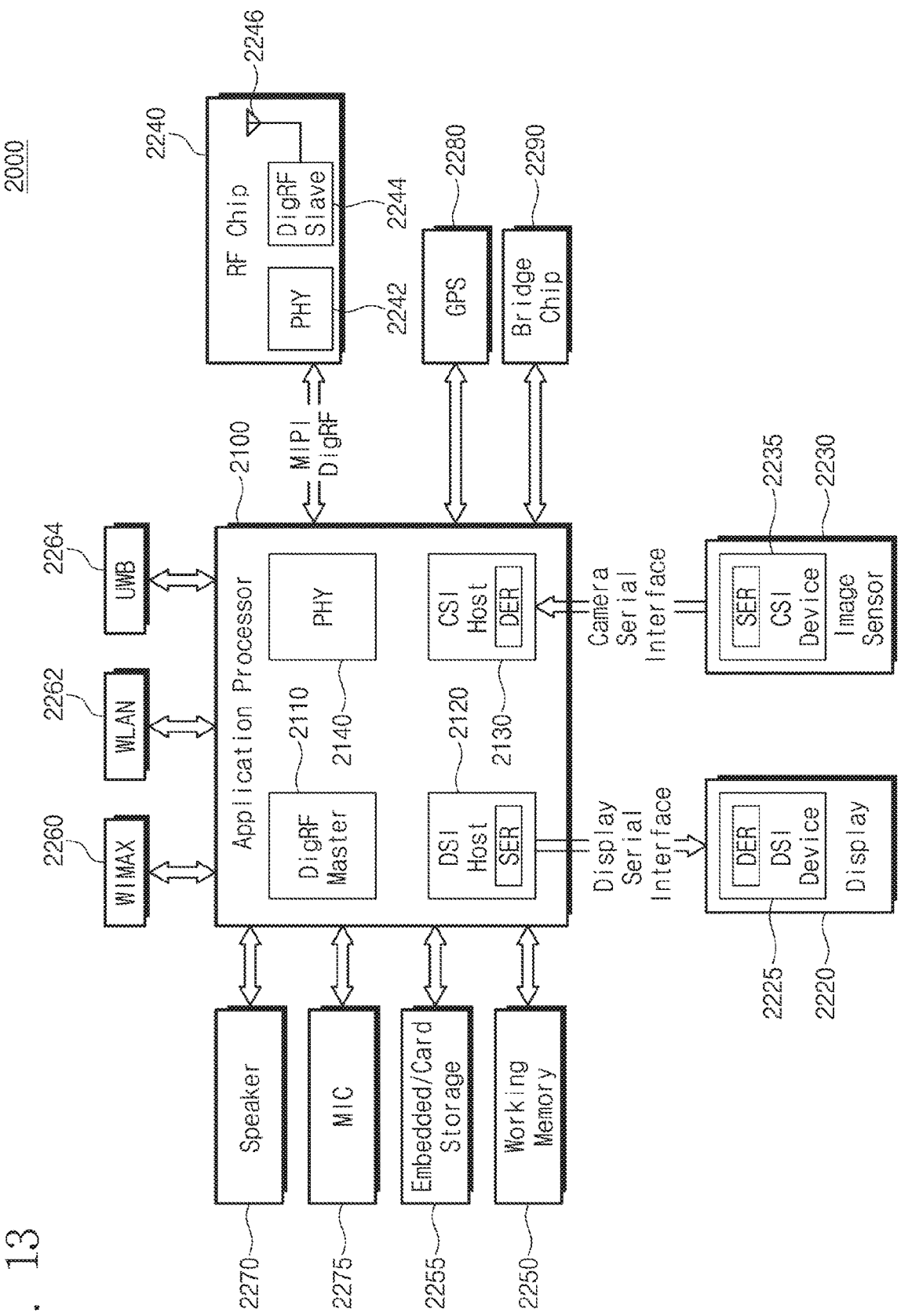
FIG. 13 is a block diagram illustrating an electronic system to which a memory system according to an exemplary embodiment of the inventive concept is applied.

FIG. 13 is a block diagram illustrating an electronic system to which a memory system according to an exemplary embodiment of the inventive concept is applied. Referring to FIG. 13, an electronic system 2000 may be implemented in the form of a portable communication terminal, a personal digital assistant (PDA), a portable multimedia player (PMP), a smartphone, or a wearable device, or in the form of a computing system such as a personal computer, a server, a workstation, or a notebook computer.

The electronic system 2000 may include an application processor 2100 (or a central processing unit), a display 2220, and an image sensor 2230. The application processor 2100 may include a DigRF master 2110, a display serial interface (DSI) host 2120, a camera serial interface (CSI) host 2130, and a physical layer 2140.

The DSI host 2120 may communicate with a DSI device 2225 of the display 2220 through the DSI. In an exemplary embodiment of the inventive concept, an optical serializer SER may be implemented in the DSI host 2120, and an optical deserializer DER may be implemented in the DSI device 2225. The CSI host 2130 may communicate with a CSI device 2235 of the image sensor 2230 through the CSI.

In an exemplary embodiment of the inventive concept, an optical deserializer DER may be implemented in the CSI host 2130, and an optical serializer SER may be implemented in the CSI device 2235.

The electronic system 2000 may further include a radio frequency (RF) chip 2240 for communicating with the application processor 2100. The RF chip 2240 may include a physical layer 2242, a DigRF slave 2244, and an antenna 2246. In an exemplary embodiment of the inventive concept, the physical layer 2242 of the RF chip 2240 and the physical layer 2140 of the application processor 2100 may exchange data with each other through an MIPI DigRF interface.

The electronic system 2000 may further include a working memory 2250 and embedded/card storage 2255. The working memory 2250 and the embedded/card storage 2255 may store data received from the application processor 2100. The working memory 2250 and the embedded/card storage 2255 may provide the data stored therein to the application processor 2100.

The working memory 2250 may temporarily store data which are processed or will be processed by the application processor 2100. The working memory 2250 may include a volatile memory such as a static random access memory (SRAM), a dynamic RAM (DRAM), or a synchronous DRAM (SDRAM), or a nonvolatile memory such as a flash memory, a PRAM, a MRAM, a ReRAM, or a FRAM. The embedded/card storage 2255 may store data regardless of whether power is supplied.

In an exemplary embodiment of the inventive concept, the working memory 2250 may be a memory device described above with reference to FIGS. 1 to 13. Alternatively, the working memory 2250 may operate based on the operation method described above with reference to FIGS. 1 to 13.

The electronic system 2000 may communicate with an external system through a worldwide interoperability for microwave access (WiMAX) 2260, a wireless local area network (WLAN) 2262, and an ultra-wideband (UWB) 2264.

The electronic system 2000 may further include a speaker 2270 and a microphone 2275 for processing voice information. The electronic system 2000 may further include a global positioning system (GPS) device 2280 for processing position information. The electronic system 2000 may further include a bridge chip 2290 for managing connections between peripheral devices.

According to exemplary embodiments of the inventive concept, ZQ calibration may be performed under the control of any one of a memory controller or a memory device, depending on a ZQ mode of the memory device. As such, an exact ZQ code may be maintained in an environment in which a ZQ code may be changed due to various factors (a temperature, a voltage, a scheme/scenario for a user to operate, etc.). For example, in the case where a memory device operates in the external ZQ mode, various environments (e.g., a temperature, a voltage, and a scheme/scenario for a user to operate) of the memory device may not be applied; in the case where the memory device operates in the internal ZQ mode, ZQ calibration may not be performed at a time intended by a memory controller due to a frequency change, a voltage change, etc. According to an exemplary embodiment of the inventive concept, since the memory device may selectively perform ZQ calibration in the external ZQ mode or the internal ZQ mode, the above-described issues may be solved. Accordingly, the reliability of the memory device and the memory system may be improved.

In addition, since the memory device as well as the memory controller may have the initiative of ZQ calibration, the utilization of the memory controller or the memory device may be improved.

According to exemplary embodiments of the inventive concept, ZQ calibration may be performed under the control of any one of a memory controller or a memory device, depending on a ZQ mode of a memory device. The memory device as well as the memory controller may have the initiative of ZQ calibration, and the utilization of the memory controller or the memory device may be improved. A memory device with improved performance, a memory system including the memory device, and an operation method of the memory device are thus provided.

While the inventive concept has been described with reference to exemplary embodiments thereof, it will be apparent to those of ordinary skill in the art that various changes and modifications in form and details may be made thereto without departing from the spirit and scope of the inventive concept as set forth in the following claims.

What is claimed is:

1. A memory device comprising:
a driver configured to drive a data line connected with an external device;
an internal ZQ manager configured to generate an internal ZQ start signal;
a selector configured to select one of the internal ZQ start signal and a ZQ start command from the external device, based on a ZQ mode;
a ZQ calibration engine configured to generate a ZQ code by performing ZQ calibration in response to a selection result of the selector; and
a ZQ code register configured to load the ZQ code onto the driver in response to a ZQ latch command from the external device.

2. The memory device of claim 1, wherein the driver drives the data line based on the loaded ZQ code.

3. The memory device of claim 1, wherein, in the case where the ZQ mode is an internal ZQ mode, the selector selects the internal ZQ start signal, and
wherein, in the case where the ZQ mode is an external ZQ mode, the selector selects the ZQ start command.

4. The memory device of claim 1, further comprising:
a mode register configured to store information about the ZQ mode.

5. The memory device of claim 4, wherein, in the case where the ZQ mode is an internal ZQ mode and the ZQ code is different from a previous ZQ code previously loaded onto the driver, the internal ZQ manager is further configured to set a ZQ update flag to the mode register.

6. The memory device of claim 5, wherein the mode register is further configured to provide the ZQ update flag to the external device in response to a mode register read (MRR) command from the external device.

7. The memory device of claim 5, wherein the internal ZQ manager is further configured to reset the ZQ update flag set to the mode register in response to the ZQ latch command from the external device.

8. The memory device of claim 4, wherein the internal ZQ manager is further configured to periodically generate the internal ZQ start signal, and
wherein the mode register further includes information about a period to generate the internal ZQ start signal.

9. The memory device of claim 4, wherein, in the case where the ZQ mode is an external ZQ mode, the ZQ latch command is input to the ZQ code register after a given time passes from a time when the ZQ start command is received, and
wherein the mode register further includes information about the given time.

10. The memory device of claim 4, wherein, in the case where the ZQ mode is an internal ZQ mode and ZQ stop information is set to the mode register, the internal ZQ manager does not generate the internal ZQ start signal for a given time.

11. The memory device of claim 1, wherein the ZQ start command and the ZQ latch command are a multi-purpose command (MPC).

12. The memory device of claim 1, wherein the memory device is configured to communicate with the external device based on a low-power double data rate (LPDDR) interface.

13. An operation method of a memory device which is connected with an external device through a data line, the method comprising:
selecting one of a ZQ start command received from the external device and an internally generated internal ZQ start signal based on a ZQ mode;
generating a ZQ code by performing ZQ calibration in response to a result of the selection;
receiving a ZQ latch command from the external device; and
loading the ZQ code onto a driver which drives the data line, in response to the ZQ latch command.

14. The method of claim 13, wherein the ZQ start command is selected in the case where the ZQ mode is an external ZQ mode, and the internal ZQ start signal is selected in the case where the ZQ mode is an internal ZQ mode.

15. The method of claim 14, further comprising:
setting a ZQ update flag in the case where the ZQ mode is the internal ZQ mode and the ZQ code and a previous ZQ code previously loaded onto the driver are different from each other.

16. The method of claim 15, further comprising:
receiving a mode register read (MRR) command from the external device; and
providing the ZQ update flag to the external device in response to the MRR command.

17. The method of claim 15, further comprising:
resetting the ZQ update flag in response to the ZQ latch command.

18. A memory system comprising:
a memory controller configured to issue a ZQ start command; and
a memory device configured to perform ZQ calibration in response to the ZQ start command, which is generated externally from the memory device by the memory controller, in the case where a ZQ mode is an external ZQ mode, and to perform the ZQ calibration in response to an internally generated internal ZQ start signal, which is generated internally by the memory device, in the case where the ZQ mode is an internal ZQ mode,
wherein, in the case where the ZQ mode is the external ZQ mode, the memory controller is further configured to issue a ZQ latch command after a given time passes from a time when the ZQ start command is issued, and
wherein the memory device is further configured to load a ZQ code, which is generated by the ZQ calibration, in response to the ZQ latch command.

19. The memory system of claim 18, wherein, in the case where the ZQ mode is the internal ZQ mode, the memory device is further configured to set a ZQ update flag based on the ZQ code generated by the ZQ calibration,
    wherein the memory controller issues the ZQ latch command to the memory device in response to the ZQ update flag, and
    wherein the memory device is further configured to load the ZQ code in response to the ZQ latch command.

\* \* \* \* \*